US009274256B2

(12) United States Patent  
Pnini-Mittler (10) Patent No.: US 9,274,256 B2  
(45) Date of Patent: Mar. 1, 2016

(54) SYSTEMS FOR ALIGNING AN OPTICAL ELEMENT AND METHOD FOR SAME

(71) Applicant: Carl Zeiss SMT GmbH, Oberkochen (DE)

(72) Inventor: Boaz Pnini-Mittler, Heuchlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 242 days.

(21) Appl. No.: 13/788,147

(22) Filed: Mar. 7, 2013

(65) Prior Publication Data

US 2013/0182344 A1 Jul. 18, 2013

Related U.S. Application Data

(63) Continuation of application No. PCT/EP2011/004767, filed on Sep. 23, 2011.

(60) Provisional application No. 61/387,526, filed on Sep. 29, 2010.

(51) Int. Cl.
*G02B 7/182* (2006.01)
*G02B 5/08* (2006.01)
(Continued)

(52) U.S. Cl.
CPC .............. *G02B 5/08* (2013.01); *B25J 9/1623* (2013.01); *B25J 9/1692* (2013.01); *G02B 7/1824* (2013.01); *G03F 7/70825* (2013.01); *G02B 5/0891* (2013.01)

(58) Field of Classification Search
CPC ............ G03F 7/70825; G03F 7/70833; B25J 17/0266; G02B 7/023; G02B 7/027

USPC .......................... 359/819, 820, 824, 871, 872  
See application file for complete search history.

(56) References Cited

U.S. PATENT DOCUMENTS 5,973,863 A 10/1999 Hatasawa et al.  
2004/0214483 A1 10/2004 Mizuno  
(Continued)

FOREIGN PATENT DOCUMENTS

DE 102009044957 8/2010  
EP 1 47 1390 10/2004  
(Continued)

OTHER PUBLICATIONS

International Search Report from corresponding PCT Application No. PCT/EP2011/004767, mailed Jun. 5, 2012, 5 pages.  
(Continued)

*Primary Examiner* — Euncha Cherry  
(74) *Attorney, Agent, or Firm* — Fish & Richardson P.C.

(57) ABSTRACT

A hexapod system is provided for aligning an optical element in semiconductor clean rooms or in a vacuum, particularly in an illumination device for a microlithographic EUV projection exposure apparatus. The system includes six hexapod supporting structures. Using a set of at least two replaceable spacer elements having a different extent in at least one direction, at least one of the six supporting structures can be adjusted. The latter is adapted so that a spacer element can be removed or a spacer element can be added while the coupling of the first coupling end to the carrying structure and the coupling of the second coupling end to the optical element are maintained. A method for aligning an optical element in semiconductor clean rooms or in a vacuum including using a hexapod system is provided.

21 Claims, 9 Drawing Sheets

(51) Int. Cl.
  *B25J 9/16* (2006.01)
  *G03F 7/20* (2006.01)

(56) References Cited

U.S. PATENT DOCUMENTS

2008/0144199 A1* 6/2008 Schoeppach et al. ......... 359/824
2008/0204674 A1   8/2008 Imoto
2010/0201964 A1* 8/2010 Kugler et al. ................. 359/811

FOREIGN PATENT DOCUMENTS

| EP | 1 632 799     | 3/2006  |
|----|---------------|---------|
| EP | 1 962 124     | 8/2008  |
| JP | 10-54932      | 2/1998  |
| JP | 2003-007804   | 1/2003  |
| JP | 2003-215423   | 7/2003  |
| JP | 2004-343101   | 12/2004 |
| JP | 2008-210867   | 9/2008  |

OTHER PUBLICATIONS

Japanese Office Action and English translation thereof for corresponding JP Appl. No. 2013-530609, 11 pages, dated Aug. 21, 2015.

* cited by examiner

SYSTEMS FOR ALIGNING AN OPTICAL ELEMENT AND METHOD FOR SAME

CROSS-REFERENCE TO RELATED APPLICATIONS

This application is a continuation of, and claims priority under 35 USC 120 to, International Patent Application Serial Number PCT/EP2011/004767, filed Sep. 23, 2011, which claims benefit under 35 USC 119 of German Patent Application 10 2010 046 944.0, filed Sep. 29, 2010. International Patent Application Serial Number PCT/EP2011/004767 also claims priority under 35 USC 119 to U.S. Ser. No. 61/387,526, filed Sep. 29, 2010. The entire contents of International Patent Application Serial Number PCT/EP2011/004767 are incorporated by reference herein.

FIELD

The disclosure relates to a hexapod system for aligning an optical element in semiconductor clean rooms or in a vacuum, particularly in an illumination device for a microlithographic EUV projection exposure apparatus. The disclosure also relates to related methods.

BACKGROUND

Microlithographic projection exposure apparatuses are used to transfer structures arranged on a mask onto a photosensitive layer, for example a photoresist or the like. For this purpose, the projection exposure apparatus includes an illumination device having a light source and an illumination system, which conditions the projection light generated by the light source and directs the conditioned light onto the mask. The mask illuminated by the illumination device is imaged onto the photosensitive layer by a projection objective.

When the wavelength of the projection light is shorter, commensurately smaller structures can be defined on the photosensitive layer with the aid of the projection exposure apparatus. For this reason, increasing use is now being made of projection light in the extreme ultraviolet spectral range, i.e. so-called EUV radiation, the central wavelength of which is at 13.5 nm. Such projection exposure apparatuses are often referred to for short as EUV projection exposure apparatuses.

Because, in general, there are no optical materials which have a sufficiently high transmissivity for such short wavelengths, an EUV projection exposure apparatus usually includes reflective optical elements in the form of mirrors. The mirrors are arranged in the illumination device of the EUV projection exposure apparatus, and the mirrors are used to guide the light onto the mask to illuminate the mask. With the aid of the mirrors of the associated projection objective, the illuminated mask is correspondingly imaged onto the photosensitive layer.

In order to carry this out with the desired accuracy, the mirrors are aligned precisely in all six degrees of freedom.

For precise alignment of mirrors in a projection objective, among other things, hexapod systems are known which operate according to different principles.

Thus, for example, hexapod systems are known which have a baseplate as a carrying structure which can be adjusted via replaceable spacer elements. With these known hexapods, to replace a spacer element and align the mirror carried by the hexapod, the mirror is first separated from the supporting structures and removed from the hexapod. After particular spacer elements have been replaced, the mirror is reconnected to the supporting structures of the hexapod. However, forces are exerted on the components involved, so that the alignment of the mirror is changed from the desired target alignment relative to the hexapod. If appropriate, this is corrected by readjustment which may, in turn, be subject to these perturbing influences.

Other known hexapod systems operate according to another principle and include solid-state articulations. Examples are described, for example, in EP 1 632 799 B1 or DE 10 2009 044 957 A1. Such hexapods include six supporting structures in the form of supporting arms, by which the optical element is carried and which cooperate in parallel kinematics. Two supporting arms in this case respectively form a bipod unit. In EP 1 632 799 B1, one coupling end of a supporting arm can move so that the angle between the optical element and the supporting arm in question changes and the position of the optical element is modified. The working length of the supporting arm, which was mentioned in the introduction, in this case remains unchanged. In DE 10 2009 044 957 A1, the supporting arms are formed as flexural elements. When such a flexural element bends, its working length shortens.

The carrying structure is generally installed in a stationary manner in the housing of the illumination device, and may also be formed by the housing or a frame of the illumination device itself.

The interior of an illumination device is usually evacuated, typically to attain a high vacuum. For this reason—and in principle when an illumination device is used in a semiconductor clean room—the use of a drive mechanism for changing the position of a mirror (for example, in the form of actuators, micrometer screws or differential thread apparatus) is not possible or only very limitedly possible. For actuators, elaborate encapsulations are generally used to prevent degassing of actuator materials.

In the course of the operation of an illumination device, it may furthermore occur that a mirror is removed repeatedly from the illumination system and replaced by another mirror, before being remounted at a given time. Besides precise alignment of the mirrors per se, a particularly important aspect when using mirrors in an illumination device is then the reproducibility of the position and alignment of the mirror, even if for a certain time it is not used and has been temporarily stored in a storage place. When this mirror is reinstalled, it is fully positioned and aligned again. The reproducibility of the position and alignment of a mirror after its storage and refitting into the illumination device is, for known systems, in the range of up to 10 μm, so that the realignment of the mirror is comparatively elaborate.

The removal and refitting of a mirror may, however, lead to insufficiently calculable position and situation displacements of the mirror relative to the carrying structure, which impairs the accuracy of its alignment. Here, the fastening mechanism by which the mirror or the carrying structure is coupled to the supporting structure is an important factor.

Overall, the desired accuracy for the alignment of a mirror of an illumination device for microlithographic EUV projection exposure apparatuses is increasing constantly from year to year. The position and alignment of each mirror in the illumination device should nowadays preferably be adjustable with tolerances of merely 2 μm to 3 μm, or up to 7 μrad per degree of freedom.

SUMMARY

The disclosure provides hexapod systems with which the position and the alignment of an optical element in a semiconductor clean room or in a vacuum, particularly in an illumination device for a microlithographic EUV projection exposure apparatus, can be adjusted with high precision and good reproducibility without actuators. The disclosure also provides related methods.

In one aspect, the disclosure provides a hexapod system for aligning an optical element in semiconductor clean rooms or in a vacuum, particularly in an illumination device for a microlithographic EUV projection exposure apparatus. The hexapod system includes six hexapod supporting structures. Each supporting structure is couplable at a first coupling end to a carrying structure and at a second coupling end to the optical element. Each supporting structure defines a working length assigned to it, which corresponds to the distance between the carrying structure and the optical element along a principal axis established by the supporting structure. At least one adjustable supporting structure is adapted so that a spacer element can be removed from the supporting structure or a spacer element can be added to the supporting structure while the coupling of the first coupling end to the carrying structure and the coupling of the second coupling end to the optical element are maintained.

Both the carrying structure and the optical element to be aligned can remain connected to the hexapod supporting structure, and therefore to one another, while the alignment of the optical element relative to the carrying structure is changed.

It has been found that accurate alignment of an optical element can be better achieved with high reproducibility when the connections of both the optical element and the carrying structure to the hexapod supporting structure are not modified. Adjustment of the position and alignment of the optical element relative to the carrying structure can then also be carried out in situ, without this element having to be dismounted.

Even if the hexapod system together with the optical element is removed from the illumination device, the relative position of the optical element with respect to the carrying structure remains substantially unchanged. If a correspondingly accurate holder for the carrying structure is provided in the illumination device, then the optical element can be fitted and removed with correspondingly high reproducibility.

In this case it is advantageous, if a set of at least two replaceable spacer elements having a different extent in at least one direction is provided, by which the working length of at least one of the six supporting structures can be adjusted. Hereby, more than two working lengths can be adjusted.

In another aspect, the disclosure provides a hexapod system for aligning an optical element in semiconductor clean rooms or in a vacuum, particularly in an illumination device for a microlithographic EUV projection exposure apparatus. The hexapod system includes six hexapod supporting structures. Each supporting structure is couplable at a first coupling end to a carrying structure and at a second coupling end to the optical element. Each supporting structure defines a working length assigned to it, which corresponds to the distance between the carrying structure and the optical element along a principal axis established by the supporting structure. Each supporting structure includes at least one monolithic articulation by which the first coupling end can be rotated relative to the second coupling end and/or tilted relative to the second coupling end in a plane which is perpendicular to the principal axis. A set of at least two replaceable spacer elements have a different extent in at least one direction, by which the working length of at least one of the six supporting structures can be adjusted.

The disclosure is based on the discovery that prefabricated spacer elements can be manufactured with an accuracy which allows them to be used as replaceable components for modifying the position and aligning the optical element even in the case of hexapod systems operating with monolithic articulations, i.e. with solid-state articulations. The alignment of the optical element is carried out by modifying the structural setup of the hexapod supporting structures, and in particular their working length, by replacing one or more spacer elements, without a drive mechanism being provided for this purpose. The system is thus also unrestrictedly suitable for semiconductor clean rooms and/or high-vacuum operation. Alignment of the optical element is possible, in particular, by hand.

With the hexapod systems according to the disclosure, it has respectively been possible to achieve a reproducibility with deviations from the setpoint position of the optical element of 0.5 µm, or about 5 µrad.

For this type of hexapod system, it is advantageous for the at least one adjustable supporting structure to be adapted so that a spacer element can be removed from the at least one adjustable supporting structure or a spacer element can be added to the at least one adjustable supporting structure while the coupling of the first coupling end to the carrying structure and the coupling of the second coupling end to the optical element are maintained.

In general, it is favorable for the first coupling end of the at least one adjustable supporting structure to be comprised by a first module and for the second coupling end of the at least one adjustable supporting structure to be comprised by a second module, which are connected to one another by a connecting mechanism so that the distance between the first module and the second module can be varied.

In this case, it is advantageous for the first module and the second module to be connected rotationally fixed relative to one another and guided so that torques, which occur particularly in the connection of the first module to the second module, can be absorbed.

The supporting structure should offer the optical element only as little latitude for movement as possible in its target position. This is achieved, in particular, in that at least one of the two modules includes a monolithic arm element. This arm element is preferably formed as a hollow rod.

For good integration of one or more spacer elements into the supporting structure, it is advantageous if one or more spacer elements can be arranged between the first module and the second module of the at least one adjustable supporting structure.

An easily handleable connection between the modules can be achieved via a threaded connection.

If the at least one adjustable supporting structure includes a monolithic axial articulation, by which the first coupling end can be rotated relative to the second coupling end, in particular about the principal axis of the supporting structure, stresses and blockages can be avoided when replacing or adding a spacer element.

The supporting structure can be adapted even better to a movement of the optical element if it includes at least one monolithic universal articulation, by which the first coupling end can be tilted relative to the second coupling end in a plane which is perpendicular to the principal axis. Thermally induced displacements of the optical element can also be compensated for by the combination of an axial articulation and a universal articulation.

It is advantageous for the lowest natural oscillation of the system to be more than 200 Hz. This can be achieved, in particular, if the at least one adjustable supporting structure has an average Young's modulus of between 180 GPa and 230 GPa at 20° C., preferably 205 GPa at 20° C.

In order to permit a large thickness variation of the spacer elements, for example 5 mm, preferably in the range of between 0.2 and 5 mm, so that the optical element can be adjusted accordingly in this range with respect to its degrees of freedom, it is favourable for the at least one adjustable supporting structure to have a 0.2% yield strength $R_{p0.2}$ of more than 600 MPa, preferably more than 700 MPa, at 20° C. Furthermore, this yield strength is also advantageous when the system is heated during operation. Usually, however, the influences of the heating effects on the articulations of the supporting structure are about a factor of from 5 to 20 less than the desired adjustment range, with which the optical element is intended to be adjusted.

It has been possible to achieve particularly good results in terms of stiffness with at least one supporting structure which is made substantially of a high-strength steel, for example a Cr—Ni steel having a Young's modulus of 205 GPa at 20° C. and a 0.2% yield strength $R_{p0.2}$ of 650 MPa at 20° C. Spring steels or tempered steels are likewise suitable.

It is favourable for at least one bipod unit to be formed from a first adjustable supporting structure and a second adjustable supporting structure.

In this case, a bearing pedestal advantageously forms both the first coupling end of the first adjustable supporting structure and the first coupling end of the second adjustable supporting structure With a view to a thermal, i.e. temperature-independent bearing of the optical element, it is favourable for the principal axes of the first and second adjustable supporting structures to extend at an angle not equal to 0°, in particular at an angle of 90°, to one another.

Preferably, three bipod units forming a hexapod are provided.

Adaptation of the spacer elements to the design of the hexapod supporting structure and the materials used for it can advantageously be carried out if the at least one adjustable supporting structure defines a property value $Z_S = E_S * A_S / L_S$, with $E_S$=average Young's modulus of the supporting structure;
$A_S$=effective cross-sectional area $A_S$ of the supporting structure perpendicular to the principal axis;
$L_S$=effective length of the supporting structure in the direction of the principal axis;

and the spacer elements are configured so that such a property value $Z_D = E_D * A_D / L_D$ of a respective spacer element with
$E_S$=average Young's modulus of the spacer element;
$A_S$=effective cross-sectional area $A_S$ of the spacer element perpendicular to the principal axis;
$L_S$=effective length of the spacer element in the direction of the principal axis;
is at least 10 times, preferably 100 times the smallest property value $Z_S = E_S * A_S / L_S$ of the adjustable supporting structure.

In case that the spacer elements are adapted so that the thickness of the spacer elements, which defines the resulting working length of the supporting structure along the principal axis, can be modified and adjusted, a fine adjustment of the working length, for example in the submicrometer range, can be effected in a advantageous way whereas a rough adjustment of the working length, for example in the micrometer range, can be effected by the replacement of spacer elements.

In a method of the type mentioned in the introduction, the aforementioned object is now achieved in that
a spacer element is removed from the supporting structure or a spacer element is added to the supporting structure while the coupling of the first coupling end to the carrying structure and the coupling of the second coupling end to the optical element are maintained.

The advantages correspond to the advantages which have been explained above with reference to the hexapod system of the first type according to the disclosure.

BRIEF DESCRIPTION OF THE DRAWINGS

Exemplary embodiments of the disclosure will be explained in more detail below with the aid of the drawings, in which.

DESCRIPTION OF PREFERRED EXEMPLARY EMBODIMENTS

Figure 1:
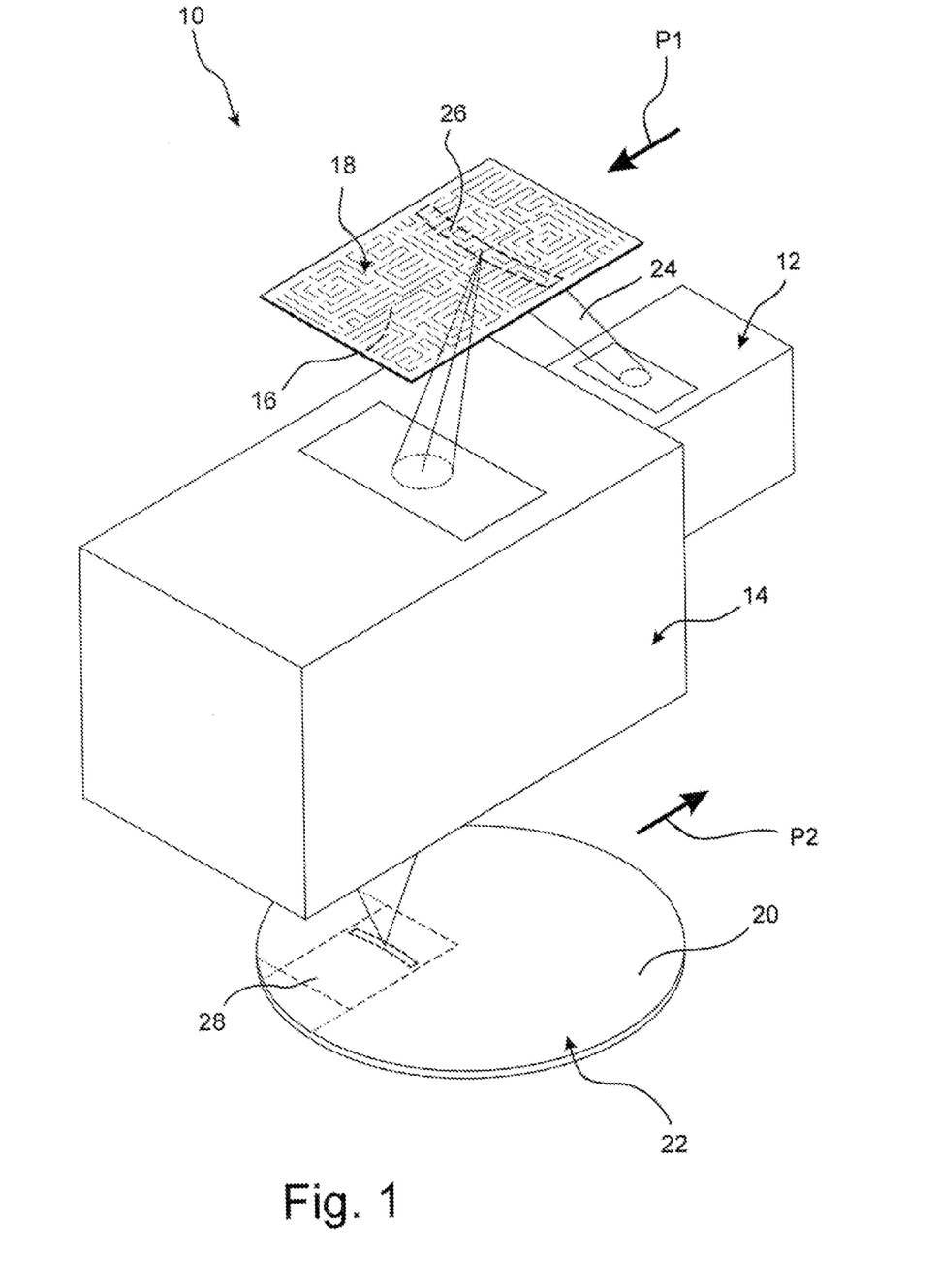
FIG. 1 shows a perspective view of a schematic microlithographic EUV projection exposure apparatus having an illumination unit and a projection objective.

FIG. 1 schematically shows a microlithographic EUV projection exposure apparatus 10, which includes an illumination device 12 and a projection objective 14.

Using the projection objective 14, reflective structures 16 which are arranged on a mask 18 are transferred onto a photosensitive layer 20. The photosensitive layer 20 is usually a photoresist and lies on a wafer 22 or another substrate.

In order to transfer the reflective structures 16 of the mask 18 onto the photosensitive layer 20, the mask 18 is illuminated with EUV radiation 24 via the illumination device 12. The illumination device 12 generates EUV radiation, which in the present exemplary embodiment has a central wavelength of 13.5 nm and a spectral width at half maximum of about 1%, so that the majority of the EUV radiation 24 leaving the illumination device 12 has wavelengths of between 13.36 nm and 13.64 nm.

On the lower side of the mask 18, the illumination device 12 illuminates a stationary field 26 which in the present exemplary embodiment corresponds to a ring segment. On the wafer 22, the projection objective 14 produces a reduced image 28 of the structures 16 which are illuminated on the mask 18 in the field 26.

Figure 2:
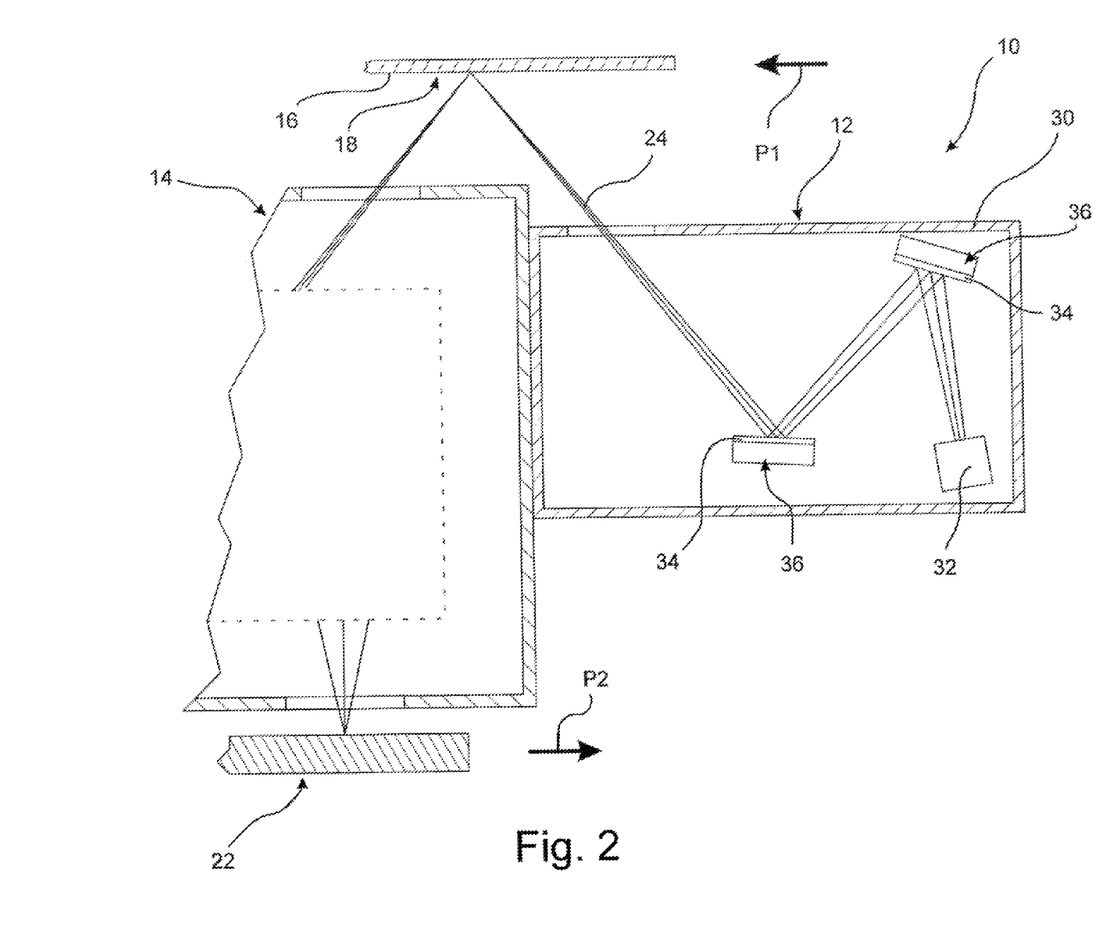
FIG. 2 shows a partial section of the EUV projection exposure apparatus of FIG. 1, two adjustment devices being shown schematically in the illumination unit, each of which respectively bears a mirror and is part of a system for aligning the mirror.

The projection objective 14 is configured for scanning operation, in which the mask 18 and the wafer 22 are moved counter to one another in a manner known per se with speeds dictated by the imaging scale of the projection objective 14. This is indicated in FIGS. 1 and 2 by the arrows P1 and P2.

The illumination device 12 includes a housing 30, in which a light source 32 (shown in FIG. 2) for the EUV radiation 24 is arranged. The EUV radiation 24 generated by the light source 32 is projected onto the mask 18 via optical elements in the form of mirrors 34. The highly schematic representation in FIG. 2 shows only two mirrors 34 and no intermediate focus.

Each mirror 34 is connected to an adjustment device 36 which is assigned to it, is arranged in the housing 30 and is used to align the respective mirror 34 in space so that the EUV radiation 24 arrives with the desired accuracy on the field 26 for illumination of the mask 18.

Figure 3:
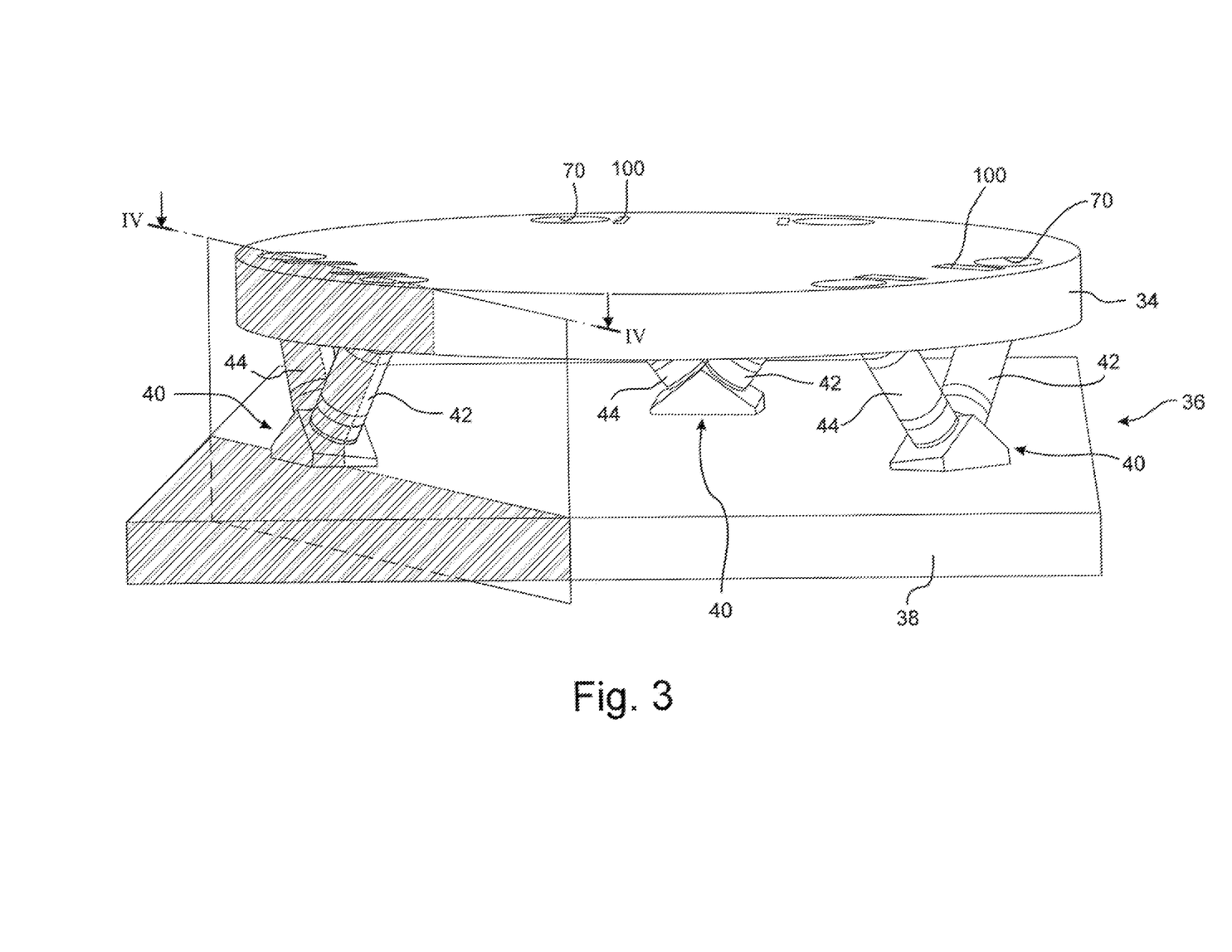
FIG. 3 shows a perspective view of an adjustment device of FIG. 2 formed as a hexapod, including three bipod units.

Such an adjustment device 36 is shown in FIG. 3, and in the present exemplary embodiment includes a baseplate 38 that bears three adjustable bipod units 40 which preferably have the same structure and are positioned at the vertices of an equilateral triangle. These bipod units 40 in turn respectively include a first supporting arm 42 and a second supporting arm 44, which are connected at one end via a common bearing pedestal 46, acting as a first coupling end, to form a V-shaped arrangement and to the baseplate 38. The supporting arms 42, 44 therefore respectively include the bearing pedestal 46 as a first coupling end and form one branch of the "V".

At their second end 46, lying away from the bearing pedestal 46, the supporting arms 42, 44 are respectively coupled to the mirror 34. The adjustment unit 36 is in this way formed overall as a hexapod.

The bipod units 40 will now be explained in more detail with reference to the example of the section shown in FIG. 4, only the supporting arm 42 being described below. For the supporting arm 44, the statements concerning the supporting arm 42 correspondingly apply accordingly. A reference coordinate system shown in FIG. 4 will be fixed to the supporting arm 42, so that it moves in space with the supporting arm 42.

The supporting arm 42 includes an arm element in the form of a hollow rod 48 having a through-channel 50, which is manufactured monolithically in a manner known per se by wire and/or sinker electrical discharge machining and defines a longitudinal axis 52 of the supporting arm 42. With regard to the V-shaped arrangement of the supporting arms 42, 44, their respective longitudinal axes 52 form an angle of 90° in the present exemplary embodiment.

The hollow rod 48 includes an upper section 54, which cooperates with the mirror 34, and a lower section 56 which is assigned to the bearing pedestal 46.

The upper section 54 and the lower section 56 of the hollow rod 48 are separated from one another somewhat and are monolithically connected to one another via four connecting webs 58, distributed uniformly in the circumferential direction, which form a monolithic axial articulation 60 of the supporting arm 42. The connecting webs 58 are formed so thinly that the upper section 54 and the lower section 56 of the hollow rod 48 can be rotated relative to one another about its longitudinal axis 52. The possible rotation angle is limited, and depends in particular on the material of the monolithic hollow rod 48, the extent of the connecting webs 58 in the z direction and on their thickness.

At its free end, the upper section 54 has an external screw thread 62, which extends as far as a circumferential counter-shoulder 64. At the free end of the upper section 54 of the hollow rod 48, there is furthermore an internal collar 66 having an internal screw thread 68; this will be discussed again below.

So that the hollow rod 48 can be connected to the mirror 34, a stepped through-bore 70 having a bearing shoulder 72 is made in the mirror 34. In FIG. 2, only two through-bores 70 are referenced.

Figure 4:
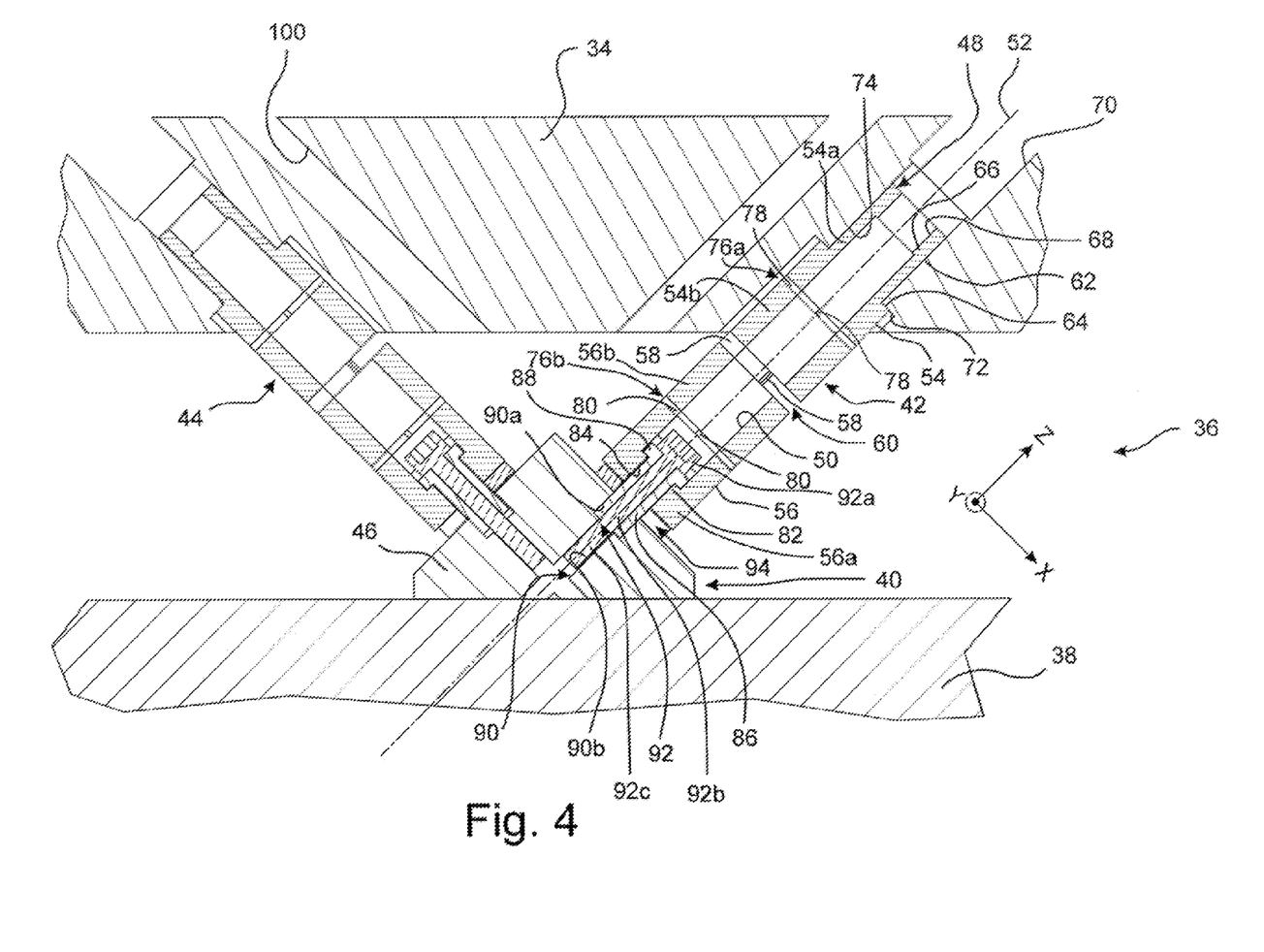
FIG. 4 shows a section of one of the bipod units of the adjustment device of FIG. 3 along the section plane IV-IV therein, which includes two multi-part supporting arms that respectively cooperate with spacers.

The hollow rod 48 can be screwed via its external screw thread 62 into an internal screw thread 74 of the through-bore 70 of the mirror 34, until its counter-shoulder 64 rests on the bearing shoulder 72 of the mirror 34, as can be seen for example in FIG. 4.

Besides the axial articulation 60, the supporting arm 42 has a monolithically integrated universal articulation 76a in its upper section 54 and a monolithically integrated universal articulation 76b in its lower section 56. To this end, four slots 78 are made in the upper section 54 of the supporting arm 42, and four slots 80 are made in the lower section 56 of the supporting arm 42, these being arranged offset respectively by 90° in the circumferential direction so that two slots 78 or 80 respectively lie opposite one another in a common plane. In FIGS. 4 and 6 to 8, only one or two slots 78 and 80 are respectively referenced.

By the first universal articulation 76a, the upper section 54 of the hollow rod 48 is subdivided into a free end part 54a and an intermediate part 54b, which are integrally connected, the free end part 54a of the hollow rod 48 with the external screw thread 62 therefore acting as a second coupling end of the supporting arm 42 and the intermediate part 54b merging into the axial articulation 60.

Owing to the slots 78 of the first universal articulation 76a, it is possible for the free end part 54a of the upper section 54 of the hollow rod 48 to be tilted relative to the intermediate part 54b about a first axis, which extends parallel to the y axis, and about a second axis which extends parallel to the x axis.

In a corresponding way, the second universal articulation 76b therefore subdivides the lower section 56 of the hollow rod 48 into a free end part 56a and an intermediate part 56b, which are integrally connected to one another. The intermediate part 56b in this case merges into the axial articulation 60 on the opposite side to the intermediate part 54b of the upper axial section 54 of the hollow rod 48.

Owing to the universal articulations 76a, 76b, overall the bearing pedestal 46 can be tilted relative to the free end part 54a of the upper section 54 of the hollow rod 48 about two mutually perpendicular axes respectively perpendicular to the longitudinal axis 52 and the principal axis of the supporting arm 42, i.e. the bearing pedestal 46 can therefore be tilted in a plane which is perpendicular to the longitudinal axis 52.

When the free end part 54a of the upper section 54 and/or the free end part 56a of the lower section 56 of the hollow rod 48 is correspondingly tilted, the longitudinal axis 52 of the hollow rod 48 is to be defined as coaxial with the intermediate part 54b and 56b.

On the free front side of the free end part 56a of the lower section 56 of the hollow rod 48, a through-opening 84 is formed by a circumferential inner collar 82 without a screw thread. A coupling sleeve 86 with a net external contour complementary therewith is seated in it, which has an external collar 88 on its end remaining in the through-channel 50 of the hollow rod 48 and cannot therefore slip out of the hollow rod 48 in the direction of the bearing pedestal 46.

The opposite second end of the coupling sleeve 86 is seated in a section 90a of a stepped bore 90 in the bearing pedestal 46. The section 90a of this stepped bore 90 does not have a circular section, but instead has at least one planar cross-sectional surface. The cross section of the end section of the coupling sleeve 86, which projects into the stepped bore section 90a, is formed complementarily therewith. In this way, rotation of the coupling sleeve 86 about its longitudinal axis is prevented and torques which occur can be absorbed.

The section 90a of the stepped bore narrows inwards into an internal screw thread section 90b again with a round cross section.

A fastening screw 92 extends through the coupling sleeve 86, and its screw head 92a provided with an internal hexagon bears on the external collar 88 of the coupling sleeve 86 in the through-channel 50 of the hollow rod 48. Next to the screw head 92a, the screw 92 has a thread-free smooth section 92b, which merges into a screw thread section 92c. This is complementary with the internal screw thread in the internal screw thread section 90b of the stepped bore 90 of the bearing pedestal 46.

Between the hollow rod 48 and the bearing pedestal 46, a spacer disc 94 is arranged as a spacer element and defines the distance between the hollow rod 48 and the bearing pedestal 46, and therefore also the distance between the baseplate 38 and the mirror 34 along the longitudinal axis 52 of the hollow rod 48.

The supporting arm 42, including the respectively provided spacer disc 94 and the bearing pedestal 46, together form a supporting structure whose working length is defined inter alia by this distance between the baseplate 38 and the mirror 34 along the longitudinal axis 52. The longitudinal axis 52 forms a principal axis of this supporting structure, which serves as a reference axis for the direction of the working length.

Figure 5:
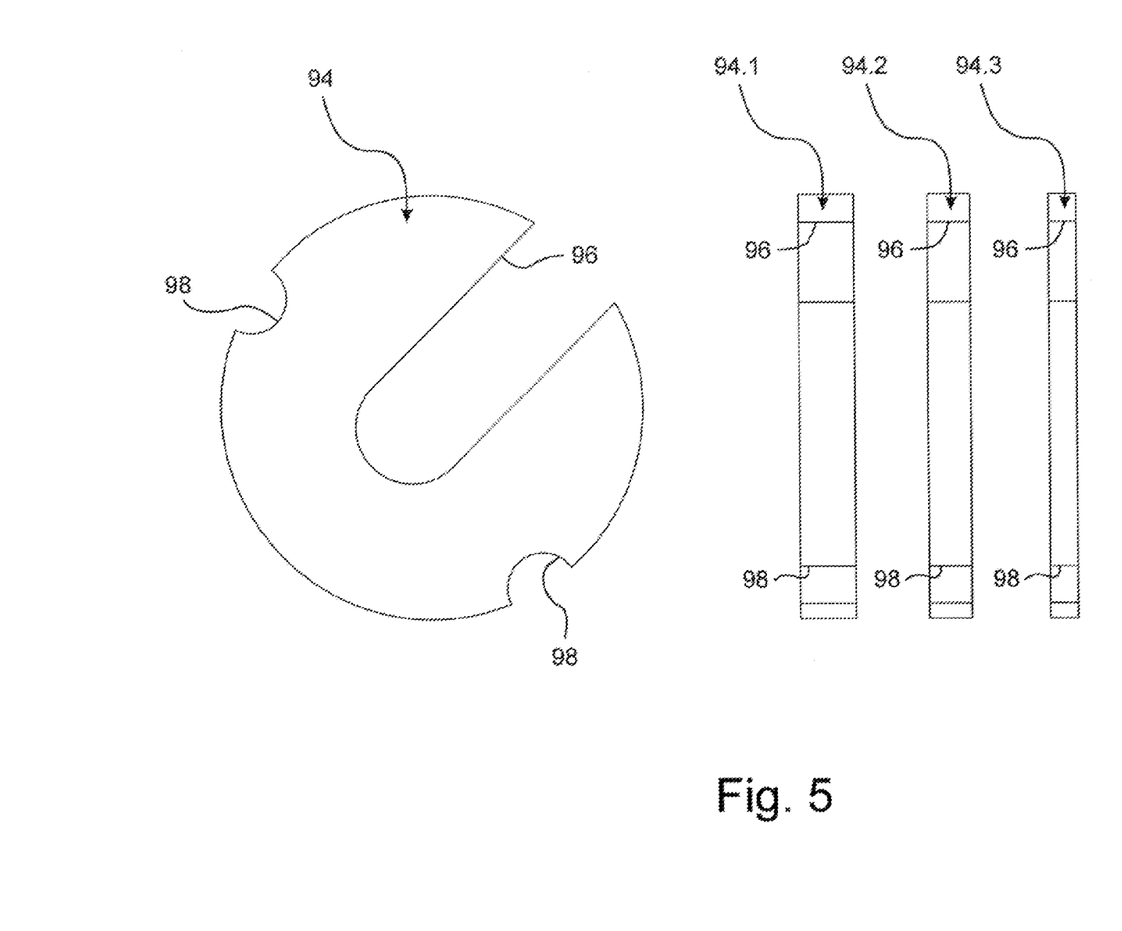
FIG. 5 shows a plan view of a spacer of FIG. 4 and by way of example three different spacers having thicknesses which are different, but not true to scale, in a side view.

As can be seen in FIG. 5, the spacer disc 94 has a tongue-shaped recess 96. This is complementary with the external radius of the coupling sleeve 86, so that the spacer disc 94 can be fitted over the coupling sleeve 86 radially from the outside.

Two indentations 98 are made in the edge of the spacer disc 94, so that the spacer disc can be gripped radially from the outside by a corresponding tool.

To this end, the mirror 34 has a through-slot 100 which, relative to the mounted supporting arm 42 when it is not tilted about its universal articulations 76a, 76b, extends perpendicularly to its longitudinal axis 52. The through-slot 100 is in this case arranged and dimensioned so that the mounted spacer disc 94 can be accessed by the aforementioned tool. In FIG. 3, only two through-slots 100 are referenced.

With respect to each bipod unit 40, a through-bore 70 and a through-slot 100 for the first supporting arm 42 and respectively a through-bore 70 and a through-slot 100 for the second supporting arm 44 are respectively provided in the mirror 34. The through-slot 100 assigned to the first supporting arm 42 is arranged next to the through-bore 70 for the second supporting arm 44, and correspondingly the through-slot 100 assigned to the second supporting arm 44 is arranged next to the through-bore 70 for the first supporting arm 42.

The alignment device 36 includes not just a single spacer disc 94, but a set of a plurality of spacer discs 94.1, 94.2, 94.3, . . . , 94.n, which differ only in their thickness. This is indicated in FIG. 5 by three spacer discs 94.1, 94.2 and 94.3 shown in a side view. The set of spacer discs 94 in the present exemplary embodiment includes spacer discs 94.1, 94.2, 94.3, . . . , 94.n having thicknesses of from 3.5 mm to 4.5 mm in steps of 10 µm. In a variant, there may also be graduations other than the 10 µm steps, which need not even be regular.

Overall, in the aforementioned exemplary embodiment the length of each supporting arm 42, 44 of each bipod unit 40 can be varied by corresponding spacer discs 94 in a range of 1 mm, for example in 5 µm steps, starting from a defined zero position, i.e. by +/−0.5 mm. Based on this adjustment range, it is advantageous to use the aforementioned steels with the specified 0.2% yield strength $R_{p0.2}$.

The adjustment device 36 may be used for a mirror 34 having a weight of up to about 200 kg. The hollow rods 48 of the bipod units 40 have in practice the length of about 75 mm and, depending on the weight of the mirror 34 to be mounted, a diameter of from about 24 mm to about 30 mm.

The baseplate 38, the bearing pedestal 46 and all the components of each supporting arm 42, 44, including the spacer discs 94, are for example made of a high-strength steel. In order to achieve the mechanical natural frequency of the adjustment device 36 of at least 200 Hz, as mentioned in the introduction, the selected material should have a Young's modulus of between 180 GPa and 230 GPa at 20° C. The 0.2% yield strength $R_{p0.2}$ should lie between 600 MPa and 700 MPa at 20° C.

In the present exemplary embodiment, the high-strength steel X46CrNi13 having a Young's modulus of 205 GPa at 20° C. and a 0.2% yield strength $R_{p0.2}$ of 650 MPa at 20° C. is used. With this material, the spacer discs 94 can be produced by known manufacturing techniques with a tolerance of +/−1.0 µm with respect to their thickness.

A thermal, i.e. thermally decoupled bearing of the mirror 34 is achieved by the adjustment device 36, so that its geometrical centre substantially occupies an unchanged position regardless of its temperature-dependent expansion. This a thermal bearing of the mirror 34 is ensured in particular by the angle of 90° between the supporting arms 42 and 44 of each bipod unit 40 in conjunction with the axial articulations 60 and the universal articulations 76a, 76b of the supporting arms 42, 44. In this way, the supporting arms 42, 44 of each bipod unit 40 can compensate for thermally induced displacements of the mirror 34, which result from its temperature-dependent expansion.

The mirror 34 can be aligned in space in 6 degrees of freedom relative to the baseplate 38 via the adjustment device 36 formed as a hexapod. The spatial position 34 is in this case modified from a starting position to a target position, by replacing one or more spacer discs 94 in one or more supporting arms 42, 44 of the three bipod units 40.

This can be done with the adjustment device 36 without the connection of the mirror 34 to the baseplate 38 or even merely to a supporting arm 42, 44 having to be released.

Figure 6:
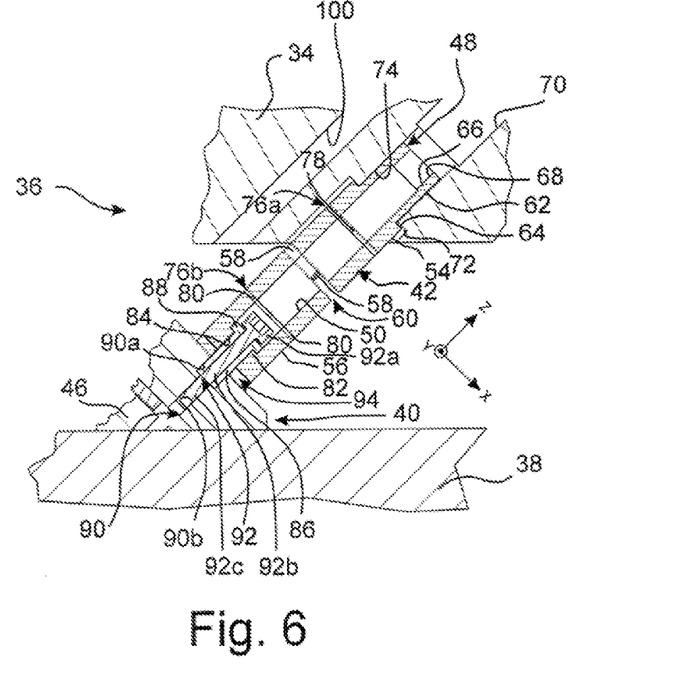
FIGS. 6 to 8 show sections corresponding to FIG. 4 of a supporting arm in three phases, which are performed when releasing a spacer from a supporting arm and replacing it.
Figure 7:
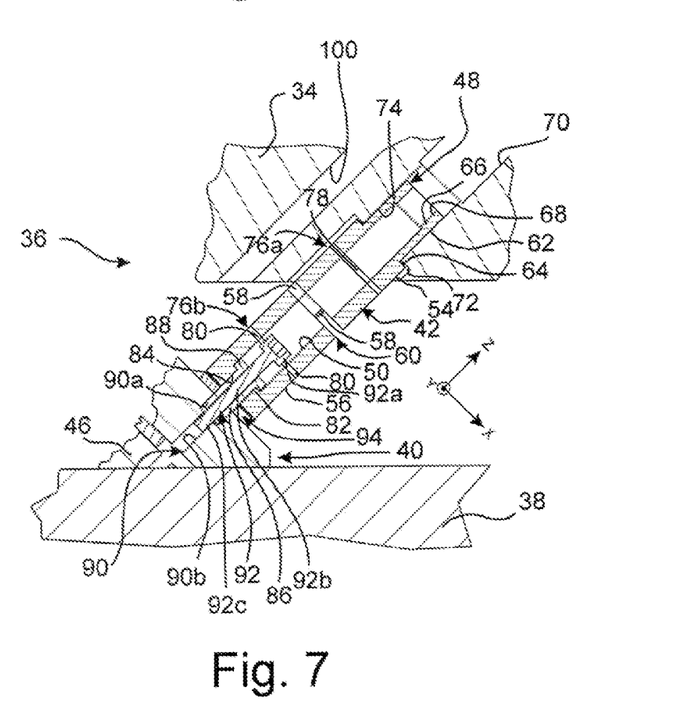

The replacement of the spacer disc 94 will now be explained with the aid of FIGS. 6 to 8 for the supporting arm 42 of a bipod unit 40:

First, FIG. 6 again shows the starting position of the mirror 34, which is to be modified. The hollow rod 48 is screwed with its external screw thread 62 at the upper section 54 into the associated through-bore 70 in the mirror 34, and at the lower section 56 it is connected to the bearing pedestal 46 via the screw 92. The spacer disc 94 provided is thereby clamped firmly between the hollow rod 48 and the bearing pedestal 46.

The screw 92 is now loosened by a tool (not itself shown) being fed from the side of the mirror 34 lying away from the supporting arm 42, through the through-bore 70 in the mirror 34 into the through-channel 50 of the hollow rod 48, until it engages in the screw head 92a of the screw 92.

The screw 92 is unscrewed somewhat—but not fully—from the internal screw thread section 90b of the bore 90 in the bearing pedestal 46, so that the mirror 34 still remains connected to the baseplate 38 via the supporting arm 42. The screw head 92a of the screw 92 is now separated from the coupling sleeve 86 in the through-channel 50 of the hollow rod 48. This is shown in FIG. 7.

The tool for the screw 92 is now removed and a counter-screw 102 is fed from the side of the mirror 34 lying away from the supporting arm 42, through the through-bore 70 in the mirror 34 into the through-channel 50 of the hollow rod 48. The counter-screw 102 has an external screw thread 104 complementary with the internal screw thread 68 on the internal collar 66 of the hollow rod 48. The counter-screw 102 is first screwed into the hollow rod 48 until its end 102a lying in the through-channel 50 of the hollow rod 48 touches the screw head 92a of the screw 92. When the counter-screw 102 is then screwed further into the hollow rod 48, both the hollow rod 48 and the mirror 34 coupled to it are moved in a direction away from the bearing pedestal 46 so that the distance between the hollow rod 48 and the bearing pedestal 46 increases.

This movement affects the alignment and orientation of the mirror 34 and all the other supporting arms 42 and 44 of the bipod units 40, and is possible owing to the axial articulations 60 and the universal articulations 76a, 76b of the individual supporting arms 42, 44. Owing to the axial articulations 60 and the universal articulations 76a, 76b, the individual supporting arms 42 and 44 can follow the position change of the mirror 34 to a certain extent, without strain or blocking taking place and without a connection of a supporting arm 42 or 44 to the mirror 34 having to be released for this purpose.

Figure 8:
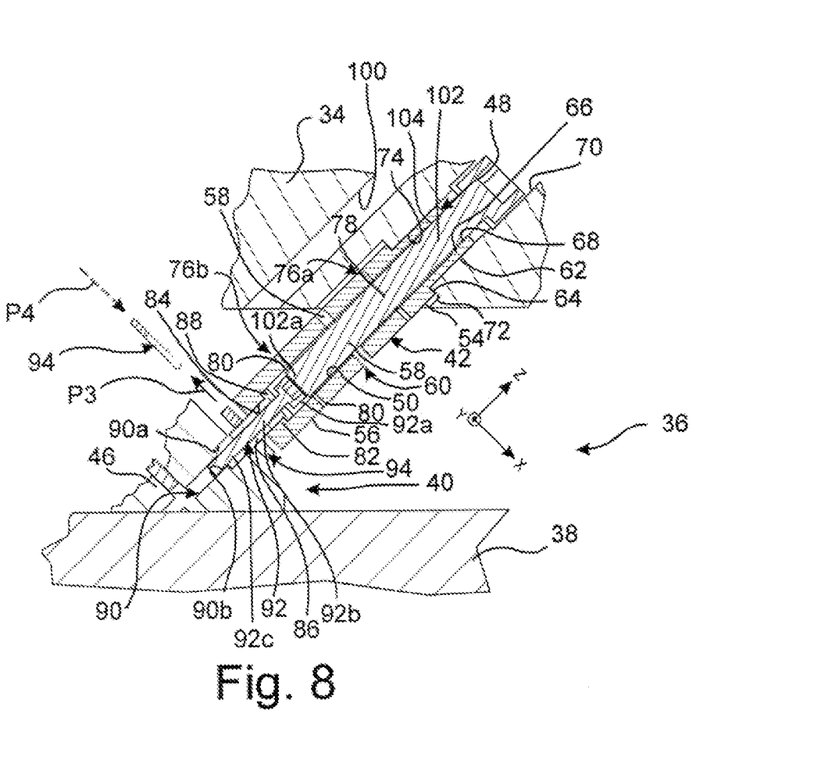

Because of the now larger distance, which can be seen in FIG. 8, between the hollow rod 48 and the bearing pedestal 46, the spacer disc 94 is no longer clamped. The gripping tool, already mentioned above, for the spacer discs 94 is now fed through the corresponding through-slot 100 (not visible in FIGS. 6 to 8) in the mirror 34. The spacer disc 94 is gripped and removed through the through-slot 100 in the mirror 34, which is indicated in FIG. 8 by an arrow P3.

A replacement spacer disc 94 having a different thickness from the removed spacer disc 94 is fed through the through-slot 100 in the mirror 34 and through the coupling sleeve 86. This process is illustrated in FIG. 8 by a spacer disc 94 shown in dashes in conjunction with the dashed arrow P4.

The counter-screw 102 is then removed again from the hollow rod 48. The screw 92 is screwed back by the corresponding tool further into the stepped bore 90 in the bearing pedestal 46, until the replacement spacer disc 94 is firmly clamped between the hollow rod 48 and the bearing pedestal 46. When the screw head 92a of the screw 92 rests on the coupling sleeve 86, it can absorb torques occurring and acting on it.

Here again a movement of the mirror 34 takes place, which the other supporting arms 42, 44 of the bipod units 40 can follow owing to their axial and universal articulations 60 and 76a, 76b, respectively.

The replacement of a spacer disc 94 in a single supporting arm 42 or 44 of a bipod unit 40 affects the overall length of the mirror 34 and leads, for each of the other supporting arms 42, 44, to a change in the relative alignment with respect to the mirror 34.

In order to bring the mirror 34 into its desired target alignment and target orientation relative to the baseplate 38, a calculation of a so-called spacer formulation is carried out, which for each supporting arm 42, 44 of each bipod unit 40 specifies a particular spacer disc 94 having a defined thickness or a combination of a plurality of spacer discs 94. Following this spacer formulation, the spacer discs 94 are assigned according to the replacement process explained above to the respectively associated supporting arm 42 or 44.

The alignment of the mirror 34 can in this case be adjusted with an accuracy of less than 2 μm, or less than 7 μrad per degree of freedom.

The adjustment device 36 in the operating state, i.e. when all the screws 92 of all the supporting arms 42, 44 are tightened, is a statically defined system. Modification of the position and alignment of the mirror 34 relative to the baseplate 38 is not possible without external intervention, since the sum of all the forces respectively in the direction of one of the three spatial axes and the sum of all the moments respectively about one of the three spatial axes are in each case equal to zero.

In combination with the internal screw thread section 90b of the stepped bore 90 of the bearing pedestal 46, the screw 92 forms a threaded connection by which the bearing pedestal 46 as a first module is connected to the hollow rod 48, including the coupling sleeve 86, as a second module, in such a way that the distance of the two modules from one another can be modified.

Figure 9:
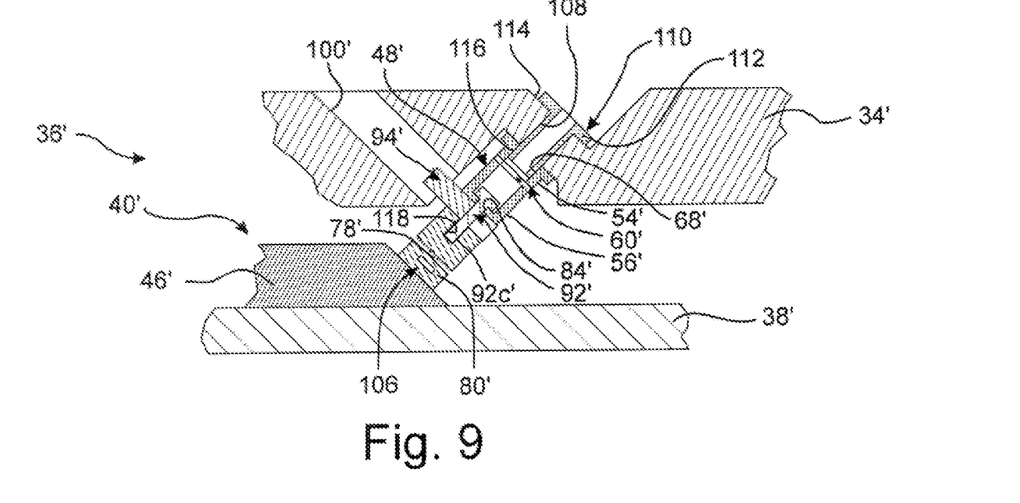
FIGS. 9 to 11 show the sections corresponding to FIGS. 6 to 8 of a supporting arm according to a second exemplary embodiment, which are performed when releasing a spacer from a supporting arm and replacing it.
Figure 10:
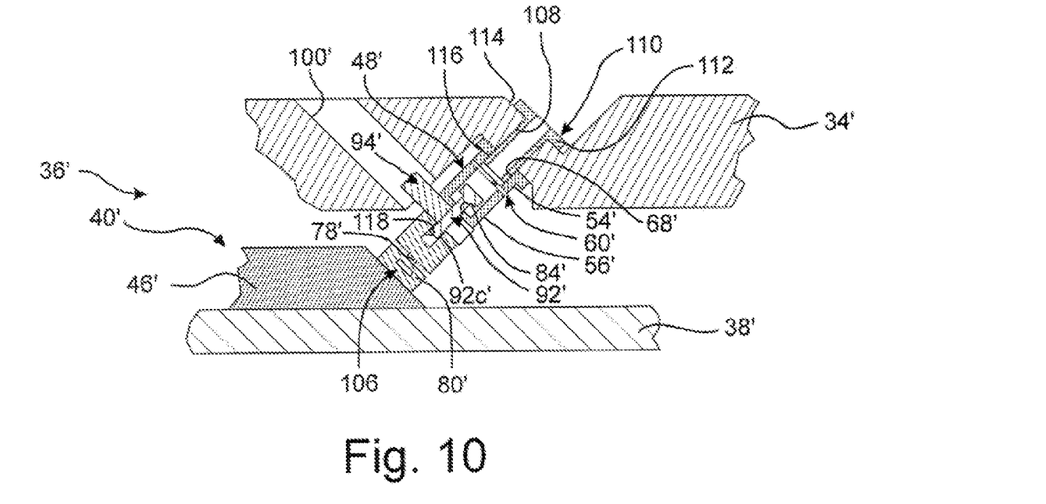
Figure 11:
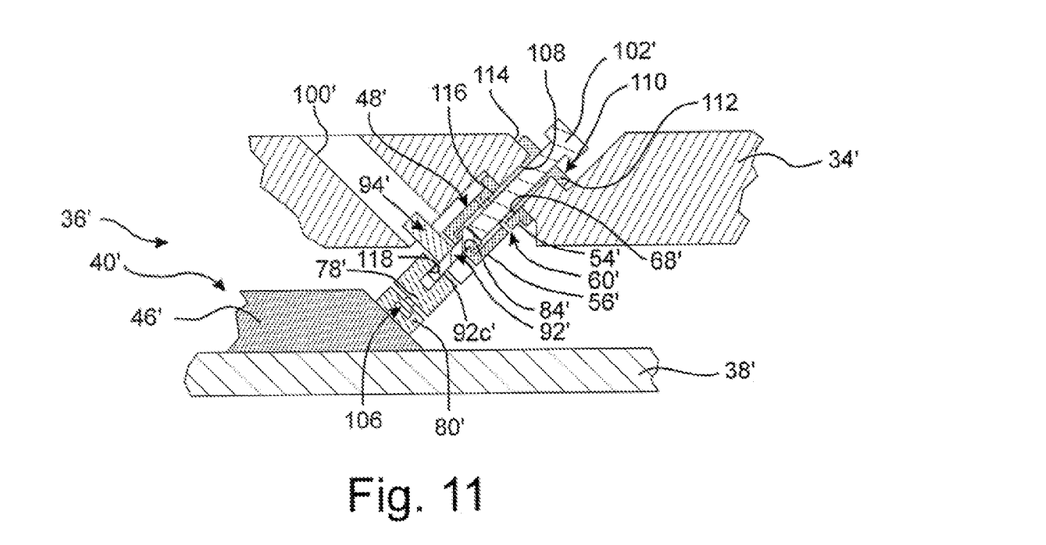

FIGS. 9 to 11 show the process of replacing a spacer disc 94 for an adjustment device 36' according to a second exemplary embodiment. There, components which correspond to those of the adjustment device 36 according to FIGS. 1 to 8 have the same references suffixed by an apostrophe. Unless otherwise expressly indicated, the statements above concerning the adjustment device 36 correspondingly apply accordingly for the adjustment device 36'.

As can be seen in FIGS. 9 to 11, the bearing pedestal 46' in the case of the adjustment device 36' bears a monolithic universal articulation unit 106 which is formed by connecting webs 78' and 80' combined in a structural unit. The hollow rod 48' correspondingly has an upper section 54' and a lower section 56', which are connected integrally to one another by the axial articulation 60' but in which a universal articulation is no longer incorporated.

Instead of the stepped bore 70, there are six through-bores 108 with a constant cross section in the mirror 34'. A fastening sleeve 110 bears on the side of the mirror 34' lying away from the bipod unit 40' with a collar 112 on an annular surface 114 enclosing the through-bore 108, and engages on the opposite side of the mirror 34' with a corresponding external screw thread 116 into the internal screw thread 68' of the hollow rod 48'.

The screw 92' in this exemplary embodiment is fed directly and without the coupling sleeve through the through-opening 84' of the hollow rod 48', and is screwed with its screw thread section 92c into a threaded bore 118 complementary therewith in the universal articulation unit 106.

In this case, the screw 92' as a threaded connection therefore connects the universal articulation unit 106 and the bearing pedestal 46', as a first module, to the hollow rod 48 as a second module, in such a way that their distance from one another can be modified.

In order to replace an existing spacer disc 94' with another spacer disc 94', in the case of the adjustment device 36' the same procedure as explained above concerning the adjustment device 36 is carried out. This means that, starting from the starting situation shown in FIG. 9, the screw 92' is first unscrewed (FIG. 10).

The counter-screw 102' is then screwed into the hollow rod 48', so that it presses on the head of the screw 92' and lifts the hollow rod 48' with the mirror 34' from the universal articulation unit 106 (FIG. 11). The spacer disc 94' is then no longer clamped between the universal articulation unit 106 and the hollow rod 48', and can be gripped and replaced with the aid of the aforementioned tool through the slot 100' in the mirror 34'.

The above-described supporting arms 42, 44 and 42', 44', which overall form solid-state articulations, respectively have an effective cross-sectional area $A_S$ [cm$^2$] and an effective arm length or arm height $L_S$ [cm]. The smallest value $Z_S = E_S * A_S / L_S$ resulting from a given average Young's modulus $E_S$ [GPa] for these solid-state articulations gives a guideline value for the configuration of the spacer discs 94, 94' described above.

They are preferably configured so that the corresponding value $Z_D=E_D*A_D/L_D$ for a respective spacer disc 94, 94' is at least 10 times, preferably 100 times the smallest value $Z_S=E_S*A_S/L_S$ of the solid-state articulations, or the supporting arms 42, 44 or 42', 44'.

The effective area Au [mm²], the effective thickness Du [mm] and the suitable material with the Young's modulus Eu for a respective spacer element 94, 94' can therefore be calculated. Application of this configuration rule for the spacer elements 94, 94' ensures that the lowest natural frequency of the system consisting of the mirror 34 or 34' and the hexapod 36 or 36' is not detrimentally shifted to lower frequencies by using spacer elements in the form of the spacer discs 94 or 94'.

Figure 12:
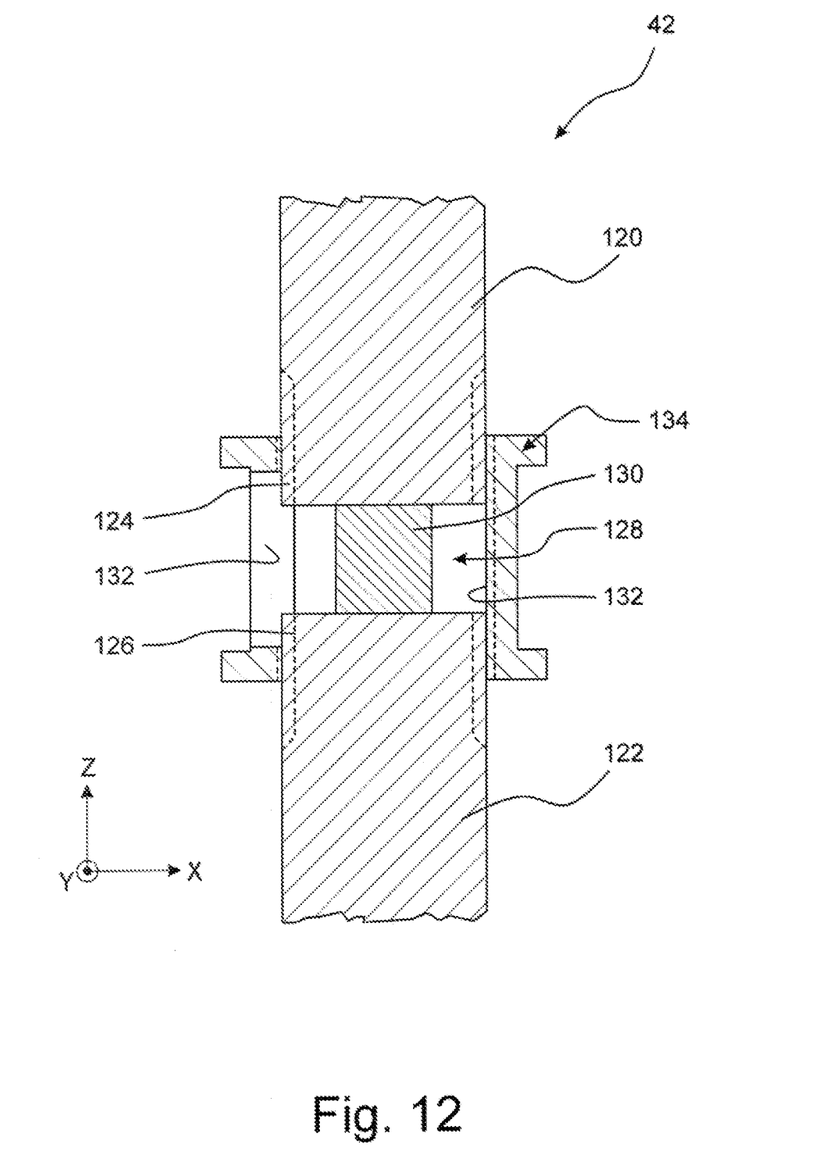
FIG. 12 schematically shows a section of a modified supporting arm.

FIG. 12 schematically shows a section of a modified support arm 42. The support arm 42 includes a first arm member 120 and a second arm member 122 which are arranged coaxially. The first arm member 120 has a threaded end 124 with an outer left-hand thread and the second arm member 122 has a threaded end 126 with an outer right-hand thread, or vice-versa. On the end remote from the threaded end 124, the first arm member 120 is coupled to the mirror 34, and on the end remote from the threaded end 126, the second arm part 122 is coupled to the bearing pedestal 46 and in this way to the base plate 38, which in the present case, for the sake of clarity, its not specifically shown.

Even this modified support arm 42 provides monolithically formed articulations, which however are also not shown.

The two threaded ends 124 and 126 of the arm members 120 and 122 are facing each other, wherein a spacing 128 remains between them in which a spacer element 130 is arranged.

A sleeve-like rotary joint 134 having an internal thread is screwed over the threaded ends 124 and 126 of the arm members 120 and 122, the rotary joint 134 being open into radial direction via passageways. By rotating the rotary joint 134 about its longitudinal axis, depending on the direction of rotation the arm members 120 and 122 can be moved toward each other or away from each other. For this, the rotary joint 134 includes contact points for an appropriate tool. The effective support arm 42 is thus formed by the arm members 120, 122 and the rotary joint 134 as well as the spacer element 130. In operation, the arm members 120 and 122 are clamped against the spacer element 130 by tightening the rotary joint 134.

In case that the working length of the support arm 42 is to be modified, the spacer element 130 is replaced by another spacer element 130, which has another extension in the z-direction than the existing spacer element 130 has. Again, there is a set of spacer elements 130, which have different extension in the z-direction, i.e. a different thickness.

First, the rotary joint 134 is rotated such that the arm members 120 and 122 move away from each other, by which the spacer element 130 in the spacing 128 is no longer clamped and therefore released. Using an appropriate tool, the existing spacer element 130 is removed through one of the passageways 132 of the rotary joint 134 from the spacing 128 and is replaced by another spacer element 130 having different thickness, which provides a different working length of the support arm 42.

Now, the rotary joint 134 is rotated such that the arm members 120 and 122 are moved back toward one another, by which the arm members 120, 122 clamp against the spacer element 130 in the spacing 128 and the new working length of the support arm 42 is adjusted.

During the entire replacement process, the coupling of the support arm 42 to the mirror 34 on the one hand and the base plate 38 on the other hand are maintained.

The different spacer elements 130 are configured in the manner of so-called spacers, as they are known per se and which do not require a special slot structure or the like. A design according to a simple washer can be also considered.

In a further modification of the above-described exemplary embodiments, the set of spacer elements, be they the above-mentioned spacer discs 94 or the above described spacer elements 130, includes actuatable spacer elements. Such an actuatable spacer elements 94, 130 can be actuated in a manner and is adapted so that its thickness, which defines the resulting working length of the support arm 42, can be modified and adjusted.

Thus, in that case the working length of the support arm 42 can be additionally modified, without the requirement that a spacer element 94, 130 has to be replaced. By modifying the thickness of such spacer elements 94, 130, the working length of the support arm 42, for example in the submicrometer range can be set, whereas a rough adjustment in the micrometer range was previously carried out by placing an appropriately sized spacer element 94, 130.

For example, such an adjustment of the thickness is possible in case of a piezoelectric element by applying a defined electric field. Another possibility exists in using a spacer element 94, 130 made from a magnetostrictive material, which thus changes its extension under the influence of a magnetic field in a predictable way. Further, a spacer element 94, 130 can be used which is made from a material which has a different extent at different temperatures. A temperature-sensitive spacer element 94, 130 can be electrically heated, for instance. As another exemplary alternative, a bellows-like and elastic spacer element 94, 130 is given, having a cavity filled with a fluid, i.e. a gas or a liquid, which expands subjected to heat, by which the extension of the spacer element 94, 130 and hereby the working length of the support arm 42 can be also adjusted.

To heat such a spacer element 94, 130, in addition to the above-mentioned electric heater also an irradiation with infrared light can be used, for instance.

What is claimed:

1. A hexapod system, comprising:
   six hexapod supporting structures,
   wherein:
   each hexapod supporting structure is couplable at a first coupling end to a carrying structure and at a second coupling end to an optical element;
   each hexapod supporting structure has a working length corresponding to a distance between the carrying structure and the optical element along a principal axis established by the supporting structure;
   for at least one of the hexapod supporting structures, the hexapod supporting structure is configured so that, while maintaining both the coupling of the first coupling end of the at least one hexapod supporting structure to the carrying structure and the coupling of the second coupling end of the at least one hexapod supporting structure to the optical element, a spacer element is removable from the supporting structure or a spacer element is addable to the supporting structure.

2. The hexapod system of claim 1, comprising a set of at least two replaceable spacer elements having a different extent in at least one direction so that the working length of at least one of the six supporting structures is adjustable.

3. The hexapod system of claim 1, wherein the first coupling end of the at least one adjustable supporting structure is comprised by a first module, the second coupling end of the at least one adjustable supporting structure is comprised by a second module, and the first and second modules are connected to each other by a connecting mechanism so that a distance between the first and second modules is variable.

4. The hexapod system of claim 3, wherein the first and second modules are connected in rotationally fixed manner relative to each other, and the first and second modules are guided to absorb torques in the connection of the first and second modules.

5. The hexapod system of claim 3, wherein the first module comprises a monolithic arm element.

6. The hexapod system of claim 3, further comprising one or more spacer elements between the first and second modules.

7. The hexapod system of claim 3, wherein the connecting mechanism comprises a threaded connection mechanism.

8. The hexapod system of claim 1, wherein the at least one adjustable hexapod supporting structure comprises a monolithic axial articulation configured to rotate the first coupling end relative to the second coupling end.

9. The hexapod system of claim 1, wherein the at least one adjustable hexapod supporting structure comprises a monolithic universal articulation configured to tilt the first coupling end relative to the second coupling end in a plane which is perpendicular to the principal axis.

10. The hexapod system of claim 1, wherein the at least one adjustable hexapod supporting structure has an average Young's modulus of between 180 GPa and 230 GPa at 20° C.

11. The hexapod system of claim 1, wherein the at least one adjustable hexapod supporting structure has a 0.2% yield strength $R_{p0.2}$ of more than 600 MPa at 20° C.

12. The hexapod system of claim 1, wherein the at least one adjustable hexapod supporting structure comprises steel having a Young's modulus of 205 GPa at 20° C. and a 0.2% yield strength $R_{p0.2}$ of 650 MPa at 20° C.

13. The hexapod system of claim 1, comprising a bipod unit comprising first and second adjustable hexapod supporting structures.

14. The hexapod system of claim 13, comprising a bearing pedestal which forms both the first coupling end of the first adjustable hexapod supporting structure and the first coupling end of the second adjustable hexapod supporting structure.

15. The hexapod system of claim 13, wherein the principal axes of the first and second adjustable hexapod supporting structures extend at an angle not equal to 0°.

16. The hexapod system of claim 13, comprising three bipod units which define a hexapod.

17. The hexapod system of claim 1, wherein:
$Z_S = E_S * A_S / L_S$;
$Z_D = E_D * A_D / L_D$;
$Z_D$ is at least 10 times a minimum value of $Z_S$;
$E_S$ = average Young's modulus of the at least one adjustable hexapod supporting structure;
$A_S$ = effective cross-sectional area $A_S$ of the at least one adjustable hexapod supporting structure perpendicular to its principal axis;
$L_S$ = effective length of the at least one hexapod adjustable supporting structure in the direction of its principal axis;
$E_D$ = average Young's modulus of a spacer element;
$A_D$ = effective cross-sectional area As of the spacer element perpendicular to the principal axis of the at least one adjustable hexapod supporting structure; and
$L_D$ = effective length of the spacer element in the direction of the principal axis of the at least one adjustable hexapod supporting structure.

18. The hexapod system of claim 1, comprising spacer elements having a thickness so that the working length of their corresponding hexapod supporting structure is adjustable along its principal axis.

19. A hexapod system, comprising:
six hexapod supporting structures;
a monolithic articulation; and
a set of at least two replaceable spacer elements,
wherein:
each hexapod supporting structure is couplable at a first coupling end to a carrying structure and at a second coupling end to an optical element;
each hexapod supporting structure has a working length corresponding to a distance between the carrying structure and the optical element along a principal axis established by the supporting structure;
the monolithic articulation configured to: a) rotate the first coupling end relative to the second coupling end; and/or b) tilt the first coupling end relative to the second coupling end in a plane which is perpendicular to the principal axis; and
the set of the at least two replaceable spacer elements has a different extent in at least one direction so that the working length of at least one of the six hexapod supporting structures is adjustable.

20. The hexapod system of claim 19, comprising at least one of adjustable hexapod supporting structure configured so that, while maintaining both the coupling of the first coupling end of the at least one hexapod supporting structure to the carrying structure and the coupling of the second coupling end of the at least one hexapod supporting structure to the optical element, a spacer element can be removed from the supporting structure or a spacer element can be added to the supporting structure.

21. A method for aligning an optical element via a hexapod system which comprises six hexapod supporting structures including a first hexapod supporting structure, each hexapod supporting structure being coupled at a first coupling end to a carrying structure and at a second coupling end, each hexapod supporting structure having a working length corresponding to a distance between the carrying structure and the optical element along a principal axis established by the supporting structure, the method comprising:
removing a spacer element from the first hexapod supporting structure or adding the spacer element to the first hexapod supporting structure while maintaining both the coupling of the first coupling end of the first hexapod supporting structure to the carrying structure and the coupling of the second coupling end of the first hexapod supporting structure to the optical element.

* * * * *